United States Patent [19]

Hiruta

[11] Patent Number: 4,764,478
[45] Date of Patent: Aug. 16, 1988

[54] METHOD OF MANUFACTURING MOS TRANSISTOR BY DUAL SPECIES IMPLANTATION AND RAPID ANNEALING

[75] Inventor: Yoichi Hiruta, Yokohama, Japan
[73] Assignee: Kabushiki Kaisha Toshiba, Kawasaki, Japan
[21] Appl. No.: 932,523
[22] Filed: Nov. 20, 1986

[30] Foreign Application Priority Data

Dec. 2, 1985 [JP] Japan .................. 60-270897

[51] Int. Cl.$^4$ .......................................... H01L 21/265
[52] U.S. Cl. ..................................... 437/29; 437/24; 437/27; 437/932; 437/942
[58] Field of Search .............. 437/29, 24, 27, 932, 437/942

[56] References Cited

U.S. PATENT DOCUMENTS

| | | | |
|---|---|---|---|
| 4,431,460 | 2/1984 | Barson et al. ........... | 29/576 B |
| 4,456,489 | 6/1984 | Wu ........................... | 148/1.5 |
| 4,560,419 | 12/1985 | Bourassa et al. ........ | 148/1.5 |
| 4,561,907 | 12/1985 | Raicu ....................... | 148/DIG. 4 |
| 4,584,026 | 4/1986 | Wu et al. ................. | 29/576 B |

OTHER PUBLICATIONS

Fair et al, J. Electrochem. Soc. 131 (1987) 2387.
Chu et al, IBM-TDB, 21 (1979) 3154.
Onga et al, Jap. Jour. Appl. Physics, 21 (1982) 1472.
Sodini, et al., "A JMOS Transistor Fabricated with 100-A Low-Pressure Nitrided-Oxide Gate Dielectric," *IEEE Transactions on Electron Devices*, vol. ED-31, No. 1, pp. 17-21, Jan. 1984.

*Primary Examiner*—Upendra Roy
*Attorney, Agent, or Firm*—Finnegan, Henderson, Farabow, Garrett and Dunner

[57] ABSTRACT

A semiconductor apparatus manufacturing method which is characterized in that the process of distributing an impurity in the gate electrode of the semiconductor apparatus is improved by the steps of depositing a gate oxide layer on a silicon substrate, mounting a polycrystalline silicon layer on said gate oxide layer, introducing boron as a first impurity in the surface of said polycrystalline silicon layer by the vapor phase diffusion process, solid phase diffusion process or ion implantation, ion-implanting arsenic or silicon, boron difluoride as a second impurity having a greater mass than the first impurity, and ensuring the uniform redistribution of the first impurity in the polycrystalline silicon layer by annealing or a Lamp Anneal process which is carried out at a low temperature and for a short time.

17 Claims, 4 Drawing Sheets

METHOD OF MANUFACTURING MOS TRANSISTOR BY DUAL SPECIES IMPLANTATION AND RAPID ANNEALING

BACKGROUND OF THE INVENTION

This invention relates to a method for manufacturing a semiconductor device, and more particularly to a method for manufacturing a semiconductor device wherein the distribution of an impurity in a gate electrode is improved.

When a gate electrode is provided during the manufacture of a MOS type semiconductor apparatus, gate oxide layer 2 is first deposited on the surface of silicon substrate 1, and then polycrystalline silicon layer 3 is mounted on the whole surface of said gate oxide layer 2 (FIG. 1). Next, an impurity, boron for example, is diffused through polycrystalline silicon layer 3 to convert said layer 3 into the p+ conductivity type to reduce resistance. The conventional process of diffusing boron through a polycrystalline silicon layer is represented by the types illustrated in FIGS. 2 to 4.

The process shown in FIG. 2 comprises the step of alternately arranging wafer 4 and plate-shaped boron nitride (BN) 5 on wafer support 6, and introducing boron into polycrystalline silicon layer 3 from boron nitride (BN) 5 by means of solid phase diffusion.

The process illustrated in FIG. 3 consists of placing a plurality of wafers 4 on wafer support 6 and introducing boron into a polycrystalline silicon layer by the vapor phase diffusion process involving the application of a gaseous atmosphere of boron trichloride (BCl$_3$).

The process set forth in FIG. 4 comprises the step of diffusing boron ion B+ into polycrystalline silicon layer 3 for activation after ion-implanting.

However, the above-mentioned conventional semiconductor apparatus manufacturing methods are all accompanied with the following drawbacks.

To begin with, when the solid phase boron diffusion is carried out from boron nitride (BN), it is necessary to apply heat treatment at a temperature ranging from 900° to 1000° C. for about 90 to 120 minutes in order to ensure the uniform distribution of boron throughout polycrystalline silicon layer 3. However, gate oxide layer 2 used with a minute MOS transistor is as thin as 100 to 150 Å, and further is possessed of a large boron diffusion coefficient. If, therefore, the abovementioned high temperature heat treatment is performed for very long, boron undesirably tends to diffuse into substrate 1 beyond gate oxide layer 2, thereby giving rise to a drop in the withstand voltage of gate oxide layer 2 and variations in the threshold voltage of the resultant transistor. Consequently, the conventional solid phase boron diffusion from boron nitride BN presents difficulties in providing a minute transistor having thin gate oxide layer 2.

Further, the vapor phase boron diffusion in an gaseous atmosphere of boron trichloride (BCl$_3$) also involves the same conditions as in the case of solid phase boron diffusion from boron nitride (BN) and encounters the above-mentioned difficulties.

On the other hand, the implantation of boron ion B+ is accompanied with the drawbacks that since the boron source is far from the polycrystalline silicon layer, and channeling readily takes place, it is impossible to ensure a peak boron concentration in the depth of polycrystalline silicon layer. When, therefore, polycrystalline silicon layer 3 has a thickness of 4000 Å, the acceleration energy of B+ is set at about 40 keV, and the region of peak boron concentration is set at a point about 1300 Å from the surface of polycrystalline layer 3. If, in this case, it is desired to ensure a uniform boron concentration in polycrystalline silicon layer 3, it will be necessary to perform annealing at a temperature of 950° C. for more than 2 hours. However, annealing continued for such a long time is accompanied with the drawbacks that boron is diffused into silicon substrate 1 beyond gate oxide layer 2 as in the aforementioned case, leading to a drop in the withstand voltage of gate oxide layer 2 and variations in the threshold voltage of a transistor.

Further, the literature "A JMOS Transistor Fabricated with 100-Å Low-Pressure Nitrided-Oxide Gate Dielectric (IEEE TRANSACTIONS ON ELECTRON DEVICES VOL, ED-31 NO. 1, JANUARY 1984 P.18 by author Charles G. Sodini et al) discloses a process of depositing a silicon oxide layer on a silicon substrate, mounting a thin silicon nitride layer on said silicon oxide layer, ion-implanting boron in the resultant polycrystalline silicon layer, performing annealing at a predetermined temperature and for a preserved length of the time, thereby effecting the diffusion of boron in an activated state. In this proposed process, the thin silicon nitride layer prevents boron from diffusing into the silicon substrate beyond the gate oxide layer. However, the silicon nitride layer is generally required to have as small a thickness as about 100 Å. But the formation of such a thin silicon nitride layer is difficult for the present-day technique of fabricating a thin layer. Moreover, the process disclosed in the above-mentioned literature involves an additional step of providing a thin silicon nitride layer, thus complicating the manufacturing process by that extent.

SUMMARY OF THE INVENTION

This invention has been accomplished to eliminate the difficulties encountered in the past.

To attain this object, the present invention provides a semiconductor apparatus manufacturing method, which comprises the steps of:

depositing an insulation layer on the surface of a semiconductor substrate;

forming a polycrystalline silicon layer on said insulation layer;

introducing a first impurity of the predetermined conductivity type in the proximity of the surface of said polycrystalline silicon layer; and ion-implanting a second impurity having a greater mass than said first impurity, thereby ensuring the uniform redistribution of said first impurity in said polycrystalline silicon layer.

The above-mentioned process is characterized in that a first impurity is introduced into the proximity of the surface of a polycrystalline silicon layer in order to let it have a predetermined conductivity type; and ion-implanting a second impurity having a greater mass than said first impurity; the first impurity can be uniformly redistributed by the kinetic energy of the second impurity; the heat treatment for the introduction of the first impurity into the proximity of the surface of the polycrystalline layer can be finished in a short time; consequently the first impurity does not diffuse into the substrate beyond the gate oxide layer, thereby preventing a drop in the withstand voltage of the gate oxide layer and variations in the threshold voltage of the transistor.

As used herein, the term "the depth of the proximity of the surface of the polycrystalline silicon layer into which said first impurity is introduced" is defined to mean such depth as prevents the first impurity from penetrating through the gate oxide layer under the condition of the predetermined thickness of said gate oxide layer and heat treatment.

BRIEF DESCRIPTION OF THE DRAWINGS

FIG. 2 shows the manner in which a wafer and plate-shaped boron nitride are arranged alternately on a wafer support, and boron is introduced into a polycrystalline silicon layer from boron nitride by means of solid phase diffusion;

FIG. 3 shows the manner in which a plurality of wafers are placed on wafer a support and boron is introduced into a polycrystalline silicon layer by the vapor phase diffusion process involving the application of a gaseous atmosphere of boron trichloride;

FIG. 4 shows the manner in which a boron ion is diffused into a polycrystalline silicon layer after ion-implanting;

FIG. 5A shows the manner in which after depositing a gate oxide layer on the surface of a silicon substrate, a polycrystalline silicon layer is formed over the whole surface of said gate oxide layer, and a region containing highly concentrated boron is formed by leaving said polycrystalline silicon layer in an atmosphere of boron trichloride;

FIG. 5B shows the manner in which an arsenic ion is ion-implanted into a polycrystalline layer;

DETAILED DESCRIPTION OF THE PREFERRED EMBODIMENTS

Description may now be made with reference to the accompanying drawings of a semiconductor apparatus manufacturing method embodying the present invention.

Figure 1:
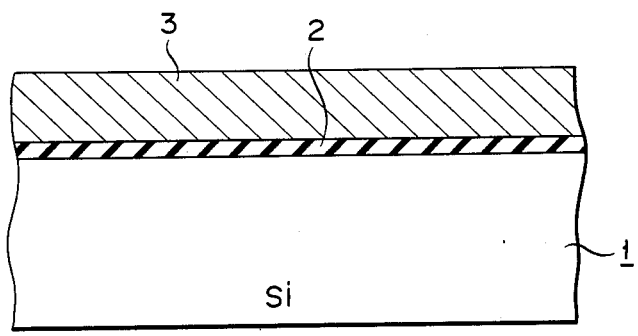
FIG. 1 shows the manner in which a gate oxide layer and polycrystalline silicon layer are superposed on a silicon substrate in the order mentioned as counted from said substrate.
Figure 2:
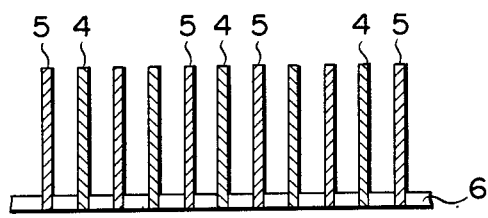
FIGS. 2 to 4 indicate the sequential steps of the conventional process of introducing an impurity into a polycrystalline silicon layer; namely
Figure 3:
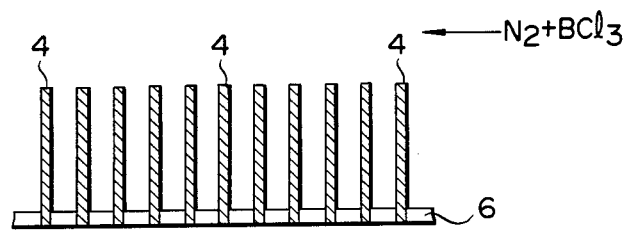
Figure 4:
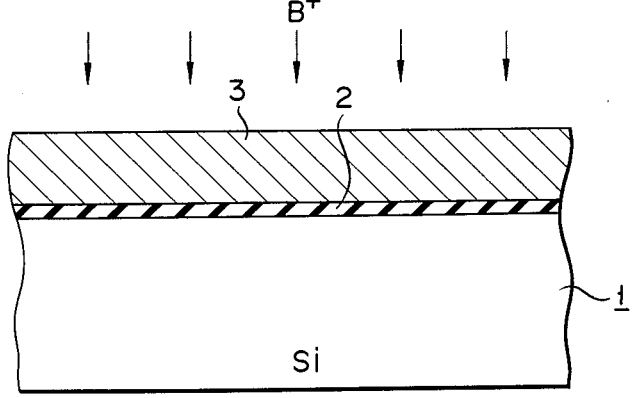
Figure 5A:
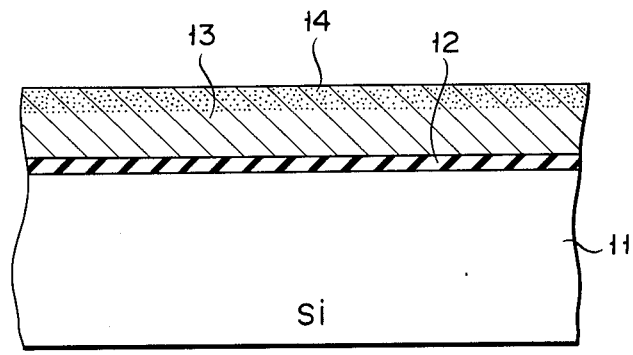
FIGS. 5A and 5B illustrate the sequential steps of the process of introducing an impurity into a polycrystalline silicon layer which is involved in the semiconductor apparatus manufacturing method embodying the present invention; namely

First, as shown in FIG. 5A, gate oxide layer 12 is deposited on the surface of silicon substrate 11. Then polycrystalline silicon layer 13 is formed with a thickness of 4000 Å over the whole surface of said gate oxide layer 12.

Later, region 14 containing highly concentrated boron is formed to a depth of about 1500 Å from the surface of polycrystalline silicon layer 13 by leaving said polycrystalline silicon layer 13 in an atmosphere of boron trichloride ($BCl_3$) held at a temperature of 800° C. for 20 minutes (FIG. 5A).

Figure 5B:
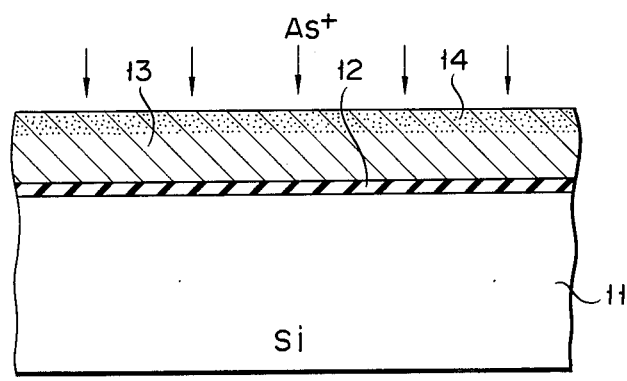

Thereafter, arsenic $As^+$ is ion-implanted under the conditions (FIG. 5B):
acceleration energy: 40 keV
dose rate: $2 \times 10^{15}$ cm$^{-2}$
Later, annealing is performed at a temperature of 900° C. for 30 minutes in an atmosphere of $N_2$ to activate the previously-introduced boron. Said polycrystalline silicon layer 13 has an expansion resistance of 200 $\Omega/\square$.

By way of comparison, polycrystalline silicon layer 13 was reduced in resistance by the conventional process which comprised the steps of ion implanting boron $B^+$ in polycrystalline silicon layer 13 under the conditions:
acceleration energy: 35 keV
dose rate: $1 \times 10^{16}$ cm$^{-2}$
and performing annealing at a temperature of 950° C. for 90 minutes.

Figure 7:
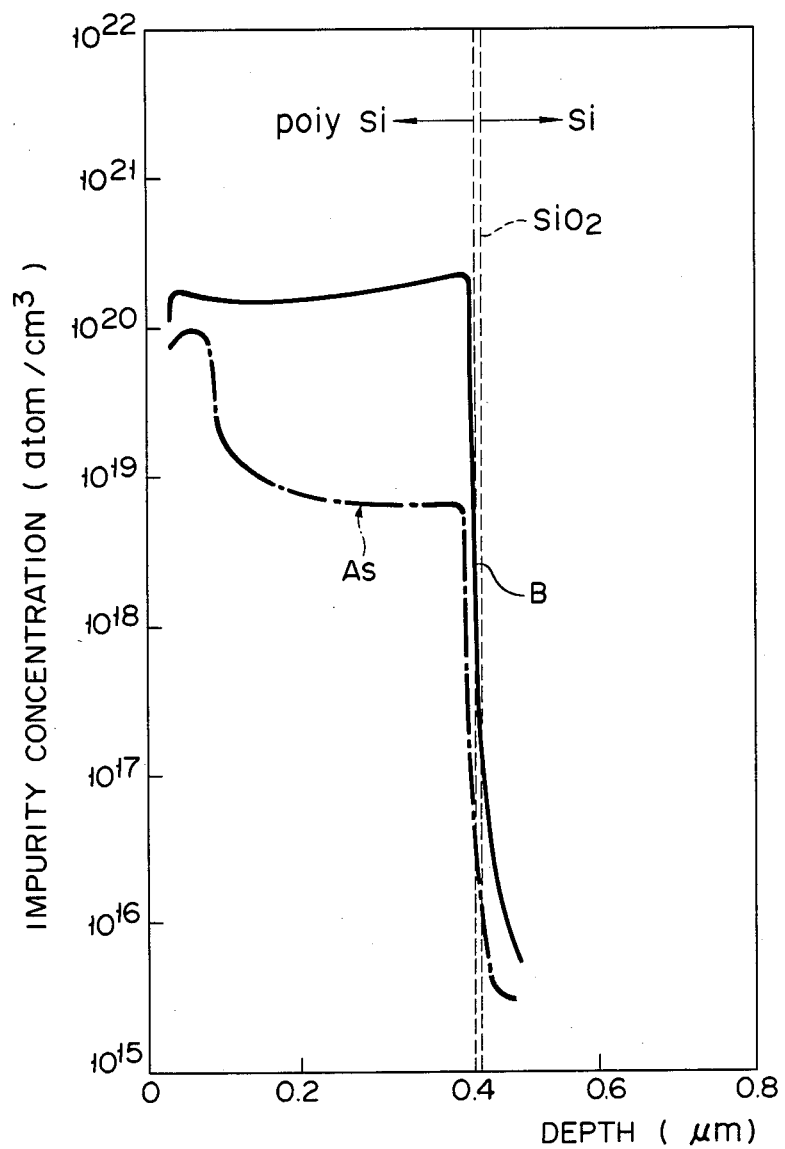
FIG. 7 graphically indicates the distribution of an impurity concentration observed in the semiconductor apparatus manufacturing method representing this invention.
Figure 8:
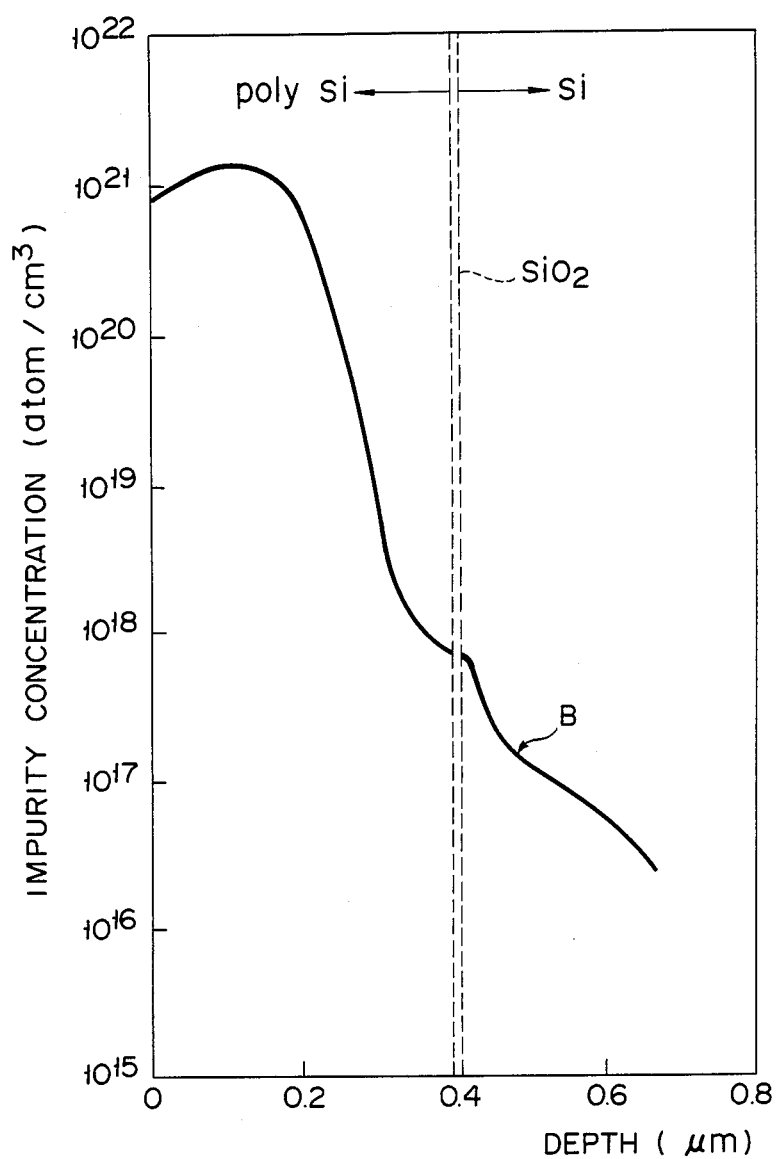
FIG. 8 graphically sets forth the distribution of an impurity concentration observed in the conventional semiconductor apparatus manufacturing method.

FIG. 7 shows the distribution of the concentration of an impurity introduced by the method of the present invention, and FIG. 8 sets forth the distribution of the concentration of an impurity introduced by the conventional method. As clearly seen from FIG. 7, the boron concentration in the polycrystalline silicon layer formed by the method of the present invention indicates a substantially uniform pattern. It is further seen that the uniform distribution of the boron concentration in the polycrystalline silicon layer was realized by the aforementioned heat treatment at a low temperature for a short period of time, thereby restricting the diffusion of boron in the interior of the silicon substrate. Consequently, the method of this invention offers the advantages of preventing a drop in the withstand voltage of the gate oxide layer and variations in the threshold voltage of a transistor.

FIG. 7 further shows the distribution of the concentration of arsenic As. As seen from FIG. 7, boron has a higher concentration than arsenic As over the whole area directed toward the depth of the polycrystalline silicon layer, thus causing said layer to have a completely $p^+$ conductivity.

Further, as shown in FIG. 8, the conventional semiconductor apparatus manufacturing method has the drawback that since heat treatment had to be performed at a high temperature for long hours, boron diffused into the interior of a silicon substrate beyond a gate oxide layer, thus giving rise to a drop in the withstand voltage of the gate oxide layer and variations in the threshold voltage of a transistor.

The above-mentioned example of the present invention refers to the case where the vapor phase diffusion process was applied in introducing boron in polycrystalline silicon layer 13 (FIG. 5A). However, the present invention is not limited to this process. Obviously it is possible to introduce boron by the solid phase diffusion process or ion implantation process. For example, when boron $B^+$ was ion implanted under the conditions:
acceleration energy: 35 keV
dose rage: $1 \times 10^{16}$ cm$^{-2}$
and boron was activated by annealing performed in an atmosphere of $N_2$ held at a temperature of 900° C. for 30 minutes, the polycrystalline silicon layer indicated an expansion resistance of 210 $\Omega/\square$, thus causing the boron concentration in the polycrystalline silicon layer to have the same distribution as illustrated in FIG. 7.

The aforementioned example of the present invention referred to the case where, after boron (first impurity) was introduced in the polycrystalline silicon layer, a second impurity of arsenic As was ion-implanted. However, the application of an atom or molecule, argon Ar or boron difluoride $BF_2$, for example, having a greater mass than boron still ensures the same effect as mentioned above. For instance, arsenic As may be replaced by silicon Si. When silicon is used as a second impurity, the compensation of boron B by arsenic As does not arise, unlike the aforesaid example, thus making it possible to form a $p^+$ polycrystalline silicon layer having a lower electric resistance.

Figure 6:
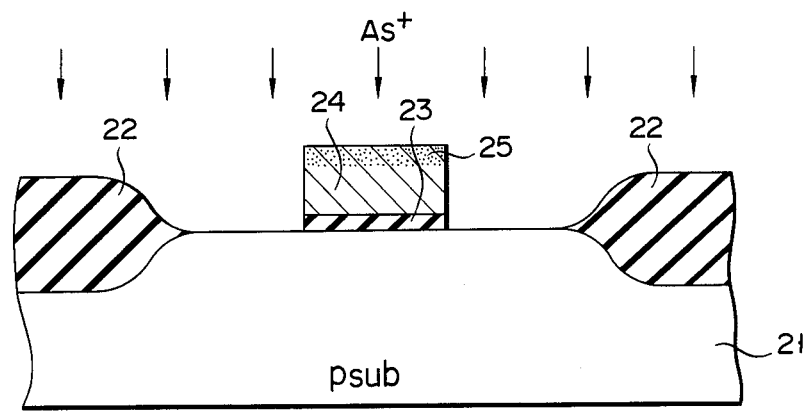
FIG. 6 illustrates the MOS transistor manufacturing method according to another example of the semiconductor apparatus manufacturing method embodying the present invention.

In the foregoing example, the activation and diffusion of boron was carried out by thermal annealing. However, the present invention is not limited to this process. Obviously, it is possible to apply, for example, the Lamp Anneal process under the conditions:
temperature: 900° C.
time: 10 to 20 seconds The aforementioned example referred to the case where the activation and diffusion of boron were undertaken by thermal annealing. When, however, the present invention is applied to the manufacture of N-MOS (N-channel MOS transistor), it is possible to perform the ion implantation of arsenic As as a second impurity after the deposition of a gate electrode. In this case, as shown in FIG. 6, field oxide layer 22 is deposited on the surface of p type silicon substrate 21, and later gate oxide layer 23 is formed. Later, a polycrystalline layer 24 is formed over the whole mass. Boron is introduced in the proximity of the surface of said layer, thereby providing region 25 having a high boron concentration (for a distinct illustration, said region is represented by a plurality of dots).

Later, the polycrystalline layer is patterned to provide a gate electrode, and then arsenic $As^{30}$ is ion-implanted. This arsenic $As^+$ is applied as a second impurity for the purpose of ensuring the uniform distribution of boron concentration in gate electrode 24, and also as an impurity for the formation of source and drain regions. This process can very easily increase the reliability of N-MOS (N-channel MOS transistor).

The foregoing description refers to the case where boron was introduced in a polycrystalline silicon layer acting as a gate electrode to convert said layer into the $p^+$ type. However, the present invention can obviously be applied with the same effect to the formation of an $n^+$ type polycrystalline silicon layer.

The aforementioned example referred to the case where the first impurity can be uniformly redistributed by the kinetic energy of the second impurity having a greater mass than said first impurity. However, the present invention can obviously be applied with the same effect to increase the velocity of the second impurity when ion-implanting is performed.

What is claimed is:

1. A method for manufacturing a semiconductor device comprising the steps of:
    depositing an insulation layer on a surface of a semiconductor substrate;
    mounting a polycrystalline silicon layer on said insulation layer;
    ion-implanting boron at a region in the proximity of the surface of said polycrystalline silicon layer; and
    after said ion-implanting of boron, ion-implanting arsenic at said region at a dose smaller than that of said boron to effect a uniform redistribution of said boron in said polycrystalline silicon layer.

2. The method according to claim 1, wherein said boron is ion-implanted at an acceleration energy of approximately 35 keV, at a dose of approximately $1 \times 10^{16}$ cm$^{-2}$.

3. The method according to claim 1, wherein said arsenic is ion-implanted at an acceleration energy of approximately 40 keV, at a dose of approximately $2 \times 10^{15}$ cm$^{-2}$.

4. The method according to claim 1, wherein after the uniform redistribution of said boron in said polycrystalline silicon layer, annealing is performed to activate said boron.

5. The method according to claim 1, wherein after the redistribution of said boron in said polycrystalline silicon layer, Lamp Anneal process is performed to activate said boron.

6. The method according to claim 1, wherein said ion implantation of arsenic is effected after a gate electrode is formed by patterning said polycrystalline silicon layer.

7. A method for manufacturing a semiconductor device comprising the steps of:
    depositing an insulation layer on a surface of a semiconductor substrate;
    mounting a polycrystalline silicon layer on said insulation layer;
    introducing a first impurity of a predetermined conductivity type at a region in the proximity of the surface of said polycrystalline silicon layer by vapor phase diffusion; and
    after said introducing of said first impurity, ion-implanting a second impurity at said region having a greater mass than said first impurity to effect a uniform redistribution of said first impurity in said polycrystalline silicon layer.

8. The method according to claim 7 wherein said vapor phase diffusion is performed in an atmosphere of boron trichloride.

9. The method according to claim 7, wherein said first impurity of a predetermined conductivity type is introduced by solid phase diffusion process.

10. The method according to claim 7, wherein activation of said first impurity in said polycrystalline silicon layer is effected by annealing.

11. The method according to claim 7, wherein activation of said first impurity of said polycrystalline silicon layer is effected by Lamp Anneal process.

12. The method according to claim 7, wherein said ion implantation of said second impurity having a greater mass than said first impurity is effected after a gate electrode is formed by patterning said polycrystalline silicon layer.

13. The method according to claim 7, wherein said first impurity is formed of boron.

14. The method according to claim 7, wherein said second impurity is prepared from arsenic.

15. The method according to claim 7, wherein said second impurity consists of silicon.

16. The method according to claim 7, wherein said second impurity is formed from boron difluoride.

17. The method according to claim 7, wherein said second impurity consists of argon.

* * * * *